United States Patent
Wang et al.

(10) Patent No.: US 10,558,285 B2
(45) Date of Patent: Feb. 11, 2020

(54) TOUCH SUBSTRATE AND TOUCH DISPLAY DEVICE

(71) Applicants: BOE Technology Group Co., Ltd., Beijing (CN); Hefei Xinsheng Optoelectronics Technology Co., Ltd., Hefei (CN)

(72) Inventors: Shengnan Wang, Beijing (CN); Guangchao Wei, Beijing (CN); Peihuan Ning, Beijing (CN); Yuhui Lai, Beijing (CN); Chenglong Pan, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 95 days.

(21) Appl. No.: 15/743,539

(22) PCT Filed: Aug. 8, 2017

(86) PCT No.: PCT/CN2017/096459
§ 371 (c)(1),
(2) Date: Jan. 10, 2018

(87) PCT Pub. No.: WO2018/032997
PCT Pub. Date: Feb. 22, 2018

(65) Prior Publication Data
US 2019/0079615 A1    Mar. 14, 2019

(30) Foreign Application Priority Data
Aug. 19, 2016  (CN) ............... 2016 2 0907724 U

(51) Int. Cl.
*G06F 3/047*  (2006.01)
*G06F 3/041*  (2006.01)
*H05K 1/02*   (2006.01)

(52) U.S. Cl.
CPC ............ *G06F 3/0412* (2013.01); *G06F 3/047* (2013.01); *H05K 1/028* (2013.01)

(58) Field of Classification Search
CPC ........ G06F 3/041; G06F 3/0412; G06F 3/047; H05K 1/028
See application file for complete search history.

(56) References Cited

U.S. PATENT DOCUMENTS

2011/0210939 A1* 9/2011 Reynolds .............. G06F 3/0418
                                                      345/174
2013/0106747 A1  5/2013 Choi et al.
(Continued)

FOREIGN PATENT DOCUMENTS

CN    101639580 A    2/2010
CN    103092394 A    5/2013
(Continued)

OTHER PUBLICATIONS

Sep. 13, 2017—(WO) International Search Report and Written Opinion application PCT/CN2017/096459 with English Translation.

*Primary Examiner* — Stacy Khoo
(74) *Attorney, Agent, or Firm* — Banner & Witcoff, Ltd.

(57) ABSTRACT

A touch substrate and a touch display device are provided. The touch substrate includes a plurality of touch electrodes arranged to be intersected on a base substrate, two ends of each of the touch electrodes being connected to two bonding PINs constituting a PIN group; the two bonding PINs in every PIN group being arranged side by side along a width
(Continued)

direction of the bonding PIN, and being adjacent with each other without contact there-between.

14 Claims, 2 Drawing Sheets

(56) References Cited

U.S. PATENT DOCUMENTS

| | | | |
|---|---|---|---|
| 2015/0193064 A1* | 7/2015 | Lu | G06F 3/044 345/174 |
| 2016/0195967 A1 | 7/2016 | Lee et al. | |
| 2018/0004346 A1 | 1/2018 | Teramoto | |

FOREIGN PATENT DOCUMENTS

| | | |
|---|---|---|
| CN | 103970311 A | 8/2014 |
| CN | 105224116 A | 1/2016 |
| CN | 206147560 U | 5/2017 |
| WO | WO-2016107186 A1 * | 7/2016 ........... G06F 3/0416 |

* cited by examiner

TOUCH SUBSTRATE AND TOUCH DISPLAY DEVICE

The application is a U.S. National Phase Entry of International Application No. PCT/CN2017/096459 filed on Aug. 8, 2017, designating the United States of America and claiming priority to Chinese Patent Application No. 201620907724.9 filed on Aug. 19, 2016. The present application claims priority to and the benefit of the above-identified applications and the above-identified applications are incorporated by reference herein in their entirety.

TECHNICAL FIELD

Embodiments of the present disclosure relate to a touch substrate and a touch display device.

BACKGROUND

One Glass Solution (OGS) has become the predominant technical orientation of current touch-control industries. OGS requires only one layer of glass to considerably reduce a weight and a thickness thereof while improving a transmittance, thereby well satisfying demands of intelligent terminals in terms of lighter weight and smaller size and improving a display performance.

In known techniques, the OGS includes touch electrodes which are intersected. When applied with an input signal through a signal line, the touch electrode far away from a signal input end will receive a signal which has been subjected to attenuation due to a certain resistance of the touch electrode itself. It results in the touch electrode far away from the signal input end receives a signal having intensity significantly weaker than that of the signal received by the touch electrode closer to the signal input end, or even cannot receive any signal at all. Therefore, the OGS touch screen cannot perform touch detection in an accurate manner.

SUMMARY

At least one embodiment of the present disclosure provides a touch substrate and a touch display device. When bonded with a flexible printed circuit (FPC), the touch substrate provided by the embodiment of the present disclosure can reduce an occurrence of failed conduction between a bonding PIN with bilateral wiring and the FPC.

In order to achieve the objective above, the embodiment of the present disclosure adopts technical solutions as below.

One aspect of the present disclosure provides a touch substrate including a plurality of touch electrodes arranged to be intersected on a base substrate, two ends of each of the touch electrodes being connected to two bonding PINs constituting a PIN group; the two bonding PINs in every PIN group being arranged side by side along a width direction of the bonding PIN, and being adjacent with each other without contact there-between.

In an example, adjacent two side edges of the two bonding PINs in every PIN group are each provided with a concaved part and a convex part, and the convex part of one of the two bonding PINs is protruded into the concaved part of the other one of the two bonding PINs.

In an example, a shape of the convex part of the bonding PIN is one of rectangle, triangle and trapezoid; and a shape of the concaved part of the bonding PIN is complemented with the shape of the convex part.

In an example, the adjacent two side edges of the two bonding PINs in every PIN group are each provided with a plurality of concaved parts and a plurality of convex parts which are distributed uniformly.

In an example, a distance between the two bonding PINs in every PIN group is greater than or equal to 10 μm.

In an example, multiple PIN groups are arranged side by side along the width direction of the PIN group.

In an example, a distance between adjacent PIN groups is greater than a distance between the two bonding PINs in every PIN group.

In an example, a distance between adjacent PIN groups is ranged from 50 μm to 150 um.

Another aspect of the present disclosure provides a touch display device including any of the preceding touch substrates.

BRIEF DESCRIPTION OF THE DRAWINGS

Hereafter, in order to clearly describe technical solutions of the embodiments in the present disclosure in a better way, those drawings necessary for the explanation of the embodiments will be briefly introduced.

DETAILED DESCRIPTION

Hereafter, the technical solutions in the embodiments of the present disclosure will be clearly, completely described with reference to the drawings in the embodiments of the present disclosure. Obviously, the embodiments described are only a part of the embodiments, not all embodiments. Based on the embodiments in the present disclosure, all other embodiments obtained by one skilled in the art without paying inventive labor are within the protection scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
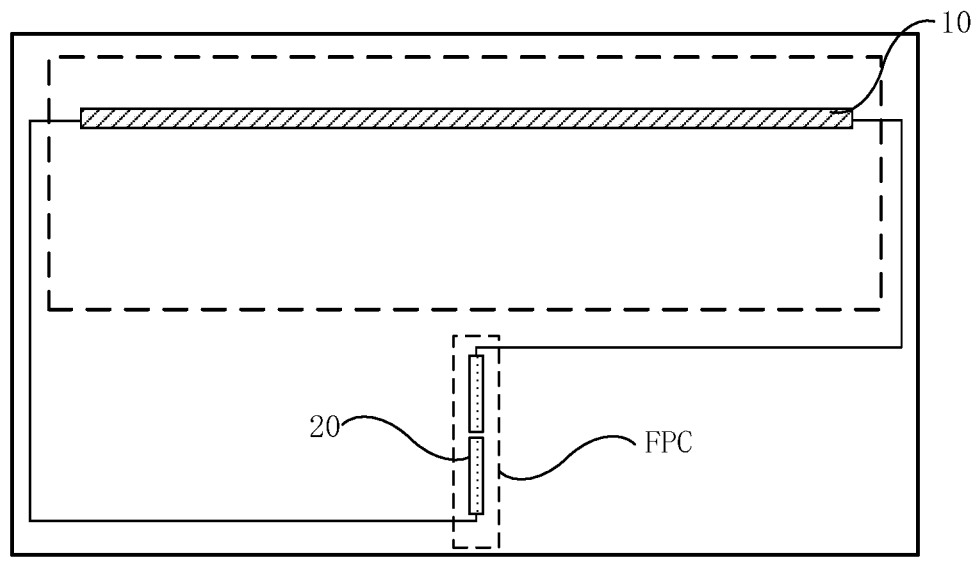
FIG. 1 is a schematic view illustrating a structure of a touch substrate with bilateral wiring.

In order to solve the technical problem existed in the known OGS technology, a solution using a bilateral wiring is proposed. As illustrated in FIG. 1, this solution is to input signals at both sides of a touch electrode 10 at the same time so as to mitigate the issue that the signal intensity is varied with a location on the touch electrode 10.

FIG. 1 illustrates the case where one horizontal touch electrode 10 is connected to one group of bilateral wirings, by way of example. Referring to FIG. 1, the above-mentioned bilateral wirings each are bonded with the flexible printed circuit (FPC) through a bonding PIN (also referred to as PIN) connected thereto, and the PINs 20 with the bilateral wirings are arranged in a same column (i.e., arranged along a length direction of the PIN) and connected to the FPC through an anisotropic conductive film (AFC). Connecting the PIN 20 to the FPC through the AFC requires a certain pressure to break off conductive particles in the AFC so as to achieve an electrical connection between the PIN 20 and the FPC.

However, during pressing against the AFC, as illustrated in FIG. 1, it's very likely to generate uneven pressure (e.g., one of the PINs 20 is pressed while the other one is not), because the two PINs 20 are arranged in a column along the length direction of the PIN which results in a relatively greater, combined length of the two PINs. This hinders sufficiently breaking the conductive particles in the AFC on the two PINs 20, and leads to a wiring at one side failing to be electrically connected with a terminal of the FPC; as a result, the signal cannot be received, and the expected effect for the use of the bilateral wiring cannot be achieved, either. Accordingly, the issue of varied signal intensity received by the touch electrode 10 depending on the location is still existed.

Figure 2:
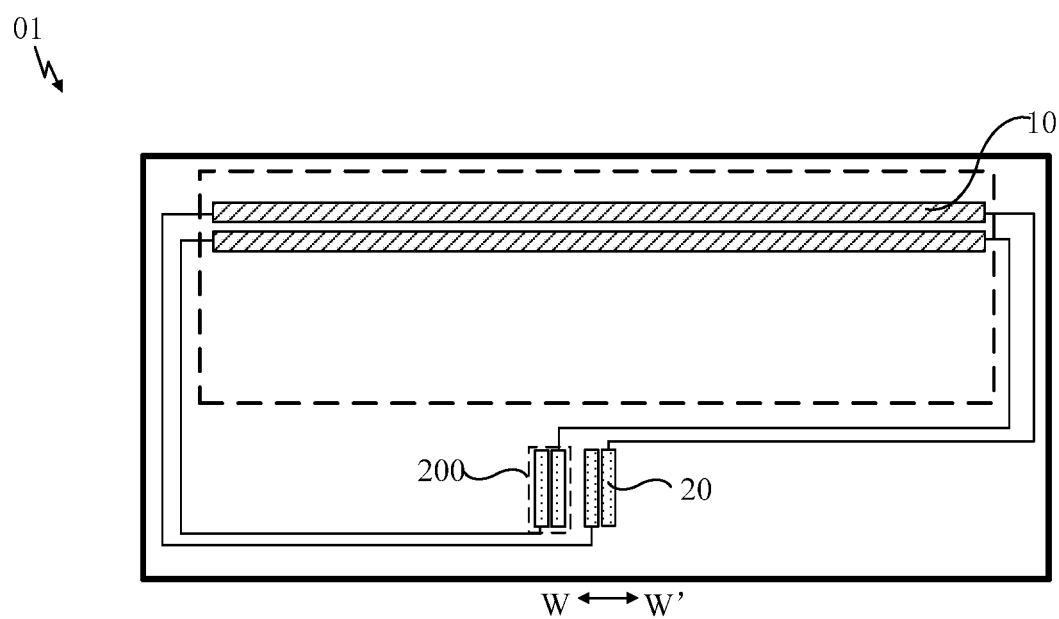
FIG. 2 is a schematic view illustrating a structure of a touch substrate with bilateral wiring provided by an embodiment of the present disclosure.

The embodiment of the present disclosure provides a touch substrate. As illustrated in FIG. 2, a touch substrate 01 includes a plurality of touch electrodes 10 arranged to be intersected on a base substrate. FIG. 2 merely illustrates two horizontal touch electrodes 10 by way of example. Every two bonding PINs connected to both ends of a same touch electrode 10 constitute a PIN group 200, and the two bonding PINs 20 in a single PIN group 200 are arranged side by side along a width direction W-W' of the bonding PIN, adjacent with each other without contact there-between.

In the above-mentioned touch substrate, every two bonding PINs, to which both ends of a same touch electrode are connected, constitute a PIN group, and the two bonding PINs adjacent to each other without contact there-between in every PIN group are arranged side by side along the width direction of the bonding PIN. In this way, on one aspect, a length of the PIN group constituted by the two bonding PINs arranged along the width direction is equal to a length of a single bonding PIN, so as to reduce the length of the bonding PIN and hence mitigate the issue of uneven pressure caused by relatively greater length of the PIN group, as compared with the case illustrated in FIG. 1 where two bonding PINs are bonded along the length direction (in such case, the length of the PIN group is at least a sum of lengths of the two bonding PINs); and on the other aspect, the two bonding PINs in the PIN group are adjacent in the width direction without contact there-between so that when the bonding PIN is bonded with the FPA, a pressure head will be pressed against the bonding PIN along the width direction of the bonding PIN, which ensures a relatively uniform pressure subjected by the bonding PIN. To sum up, when the touch substrate containing the above-mentioned PIN groups is bonded with the FPC, the issue of uneven pressure caused by the relatively greater length of the PIN group can be mitigated, and hence the occurrence of failed conduction between the bonding PIN with bilateral wiring and the FPC can be further reduced.

Herein it should be explained that, two bonding PINs 20 being adjacent to each other without contact there-between refers to the case where the two bonding PINs 20 in a single PIN group 200 are independent structures without connecting there-between. Those skilled in the art should be appreciated that, when an integrally formed PIN group 200 containing two bonding PINs 20 directly connected with each other is directly bonded with a golden finger on the FPC, it's likely to result in different intensities of shunt signals at two ends of the touch electrode 20 transmitted from the bonding PINs through bilateral wirings, and lead to inaccurate touch detection. Therefore, it needs to ensure that the two bonding PINs 20 in a PIN group 200 have identical shapes and sizes, and have no contact there-between, so as to obtain identical intensity of signal transmitted on the two bonding PINs 20.

In addition, when the above-mentioned touch substrate 01 is bonded with the FPC through the AFC, a contact area between the conductive particle in the AFC and the FPC will be increased because the conductive particle usually has a diameter about 5 μm and certainly has a deformation under pressure. Therefore, in an example, in order to prevent a single conductive particle from spanning adjacent two bonding PINs 20 and establishing an electrical connection there-between during pressing against the bonding PIN, a distance between the adjacent two bonding PINs 20 may be greater than or equal to 10 μm so that the occurrence of different intensities of shunt signals at two ends of the touch electrode 10 is avoided.

As above, considering the touch substrate 01 includes a plurality of touch electrodes 10 arranged to be intersected, in order for convenience of integrated control of the touch substrate 01 containing multiple touch electrodes 10 connected to respective bonding PINs 20, multiple PIN groups 200 may be arranged side by side along a width direction of the PIN group (that is, a width direction W-W' of the bonding PIN), as illustrated in FIG. 2. Herein, FIG. 2 illustrates the case of two PIN groups 200.

In an example, considering that the two bonding PINs 20 in a single PIN group 200 connected to one touch electrode 10 have identical input signals and identical output signals, they have no signal interference there-between. However, for different touch electrodes 10 each performing independent signal input and signal output for detection of touch position, a distance between adjacent PIN groups 200 is greater than a distance between the two bonding PINs 20 in every PIN group 200 so as to prevent from any signal interference between adjacent two PIN groups 200.

In an example, the distance between adjacent PIN groups 200 is ranged from 50 μm to 150 μm, which can avoid any signal interference between adjacent two PIN groups 200 while achieving the integrated control of the touch substrate 01.

Further to the above, when the bonding PIN 20 is bonded with the FPC and the pressure head is pressed against the bonding PIN along the width direction W-W' of the bonding PIN, for the two bonding PINs 20 in a same PIN group 200, it's still possible that one of the bonding PINs 20 is subjected to the pressure but the other one is not, along such width direction, which may result in a failed conduction between the bonding PINs 20 with bilateral wiring and the FPC. In order to solve such technical problem, in an embodiment, as illustrated in FIG. 3a, adjacent side edges of two bonding PINs 20 in a same PIN group 200 are each provided with a concaved part 201 and a convex part 202, and the convex part 202 of one of the bonding PINs 20 is protruded into the concaved part 201 of the other one of the bonding PINs 20.

In this way, when the pressure head is pressed against the bonding PIN along the width direction W-W' of the bonding PIN, the probability that both of the bonding PINs 20 are subjected to the pressure at the same time can be increased, while the occurrence of failed conduction between the bonding PINs 20 with bilateral wiring and the FPC can be reduced.

Figure 3A:
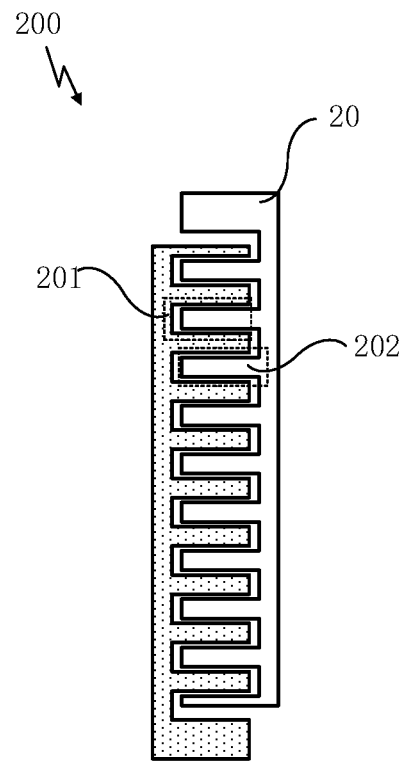
FIG. 3a is a schematic view illustrating a structure of a bonding PIN provided by an embodiment of the present disclosure.

Further to this, in order to improve the probability that both of the two bonding PINs 20 in a same PIN group 200 are subjected to the pressure at the same time, in an embodiment, as illustrated in FIG. 3a, multiple concaved parts 201 and multiple convex parts 202 are uniformly distributed on adjacent two side edges of the two bonding PINs 20, respectively.

Figure 3B:
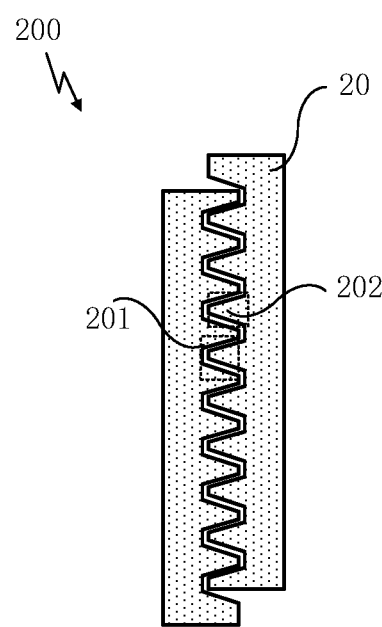
FIG. 3b is a schematic view illustrating a structure of another bonding PIN provided by an embodiment of the present disclosure.

Regarding the design of the concaved part 201 and the convex part 202 on the bonding PIN 20, it's possible that the concaved part 201 has a rectangular shape, and the convex part 202 has a shape complemented with that of the concaved part 201, i.e., rectangular shape, as illustrated in FIG. 3a; it's also possible that the concaved part 201 has a trapezoid shape, and the convex part 202 has a shape complemented with that of the concaved part 201, i.e., trapezoid shape, as illustrated in FIG. 3b; of course, the concaved part 201 may also have a triangular shape, and the convex part 202 has a shape complemented with that of the concaved part 201, i.e., triangular shape. The shapes of the concaved and convex parts are not particularly defined in the embodiments of the present disclosure, as long as the shape of the convex part 202 on one bonding PIN20 in a PIN group 200 is complemented with and hence can be protruded into the concaved part 201 of the other bonding PIN20 to improve the probability that both of the bonding PINs20 are subjected to the pressure at the same time.

The embodiment of the present disclosure further provides a touch display device including any of the touch substrates in the forgoing embodiments, which of course brings about the technical effect same as that of the touch substrate, without repeating herein.

It should be explained that, in the embodiment of the present disclosure, the touch display device at least includes liquid crystal display device and organic light-emitting display device. For example, the touch display device provided by the embodiment of the present disclosure may be any product with touch display function such as liquid crystal displayer, liquid crystal television, digital photo frame, mobile phone and tablet computer.

The foregoing are merely specific embodiments of the invention, but not limitative to the protection scope of the invention. Within the technical scope disclosed by the present disclosure, any alternations or replacements which can be readily envisaged by one skilled in the art shall be within the protection scope of the present disclosure. Therefore, the protection scope of the invention shall be defined by the accompanying claims.

The present application claims priority of Chinese patent application No. 201620907724.9 filed on Aug. 19, 2016, under the title of "A TOUCH SUBSTRATE AND A TOUCH DISPLAY DEVICE", the disclosure of which is incorporated herein in its entirety by reference.

What is claimed is:

1. A touch substrate, comprising: a plurality of touch electrodes arranged to be intersected on a base substrate, two ends of each of the touch electrodes being connected to two bonding PINs constituting a PIN group;
the two bonding PINs in every PIN group being arranged side by side along a width direction of the bonding PIN, and being adjacent with each other without contact there-between wherein
adjacent two side edges of the two bonding PINs in every PIN group are each provided with a concaved part and a convex part, and the convex part of one of the two bonding PINs is protruded into the concaved part of the other one of the two bonding PINs.

2. The touch substrate according to claim 1, wherein a shape of the convex part of the bonding PIN is one of rectangle, triangle and trapezoid; and a shape of the concaved part of the bonding PIN is complemented with the shape of the convex part.

3. The touch substrate according to claim 1, wherein the adjacent two side edges of the two bonding PINs in every PIN group are each provided with a plurality of concaved parts and a plurality of convex parts which are distributed uniformly.

4. The touch substrate according to claim 1, wherein a distance between the two bonding PINs in every PIN group is greater than or equal to 10 μm.

5. The touch substrate according to claim 1, wherein multiple PIN groups are arranged side by side along the width direction of the PIN group.

6. The touch substrate according to claim 1, wherein a distance between adjacent PIN groups is greater than a distance between the two bonding PINs in every PIN group.

7. The touch substrate according to claim 1, wherein a distance between adjacent PIN groups is ranged from 50 μm to 150 μm.

8. A touch display device, comprising a touch substrate, the touch substrate comprising: a plurality of touch electrodes arranged to be intersected on a base substrate, two ends of each of the touch electrodes being connected to two bonding PINs constituting a PIN group;
the two bonding PINs in every PIN group being arranged side by side along a width direction of the bonding PIN, and being adjacent with each other without contact there-between wherein
adjacent two side edges of the two bonding PINs in every PIN group are each provided with a concaved part and a convex part, and the convex part of one of the two bonding PINs is protruded into the concaved part of the other one of the two bonding PINs.

9. The touch display according to claim 8, wherein a shape of the convex part of the bonding PIN is one of rectangle, triangle and trapezoid; and a shape of the concaved part of the bonding PIN is complemented with the shape of the convex part.

10. The touch display according to claim 8, wherein the adjacent two side edges of the two bonding PINs in every PIN group are each provided with a plurality of concaved parts and a plurality of convex parts which are distributed uniformly.

11. The touch display according to claim 8, wherein a distance between the two bonding PINs in every PIN group is greater than or equal to 10 μm.

12. The touch display according to claim 8, wherein multiple PIN groups are arranged side by side along the width direction of the PIN group.

13. The touch display according to claim 8, wherein a distance between adjacent PIN groups is greater than a distance between the two bonding PINs in every PIN group.

14. The touch display according to claim 8, wherein a distance between adjacent PIN groups is ranged from 50 μm to 150 μm.

\* \* \* \* \*